United States Patent
Voser et al.

(10) Patent No.: US 6,916,407 B2
(45) Date of Patent: Jul. 12, 2005

(54) TARGET COMPRISING THICKNESS PROFILING FOR AN RF MAGNETRON

(75) Inventors: Stephan Voser, Buchs (CH); Eduard Karl Lorenz, Truebbach (CH)

(73) Assignee: Unaxis Trading AG, Trubbach (CH)

(*) Notice: Subject to any disclaimer, the term of this patent is extended or adjusted under 35 U.S.C. 154(b) by 139 days.

(21) Appl. No.: 10/432,428

(22) PCT Filed: Nov. 6, 2001

(86) PCT No.: PCT/CH01/00649

§ 371 (c)(1),
(2), (4) Date: May 22, 2003

(87) PCT Pub. No.: WO02/42518

PCT Pub. Date: May 30, 2002

(65) Prior Publication Data

US 2004/0050689 A1 Mar. 18, 2004

(30) Foreign Application Priority Data

Nov. 27, 2000 (CH) .............................................. 2294/00

(51) Int. Cl.⁷ .............................................. C23C 14/35
(52) U.S. Cl. .............................. 204/192.12; 204/298.12; 204/298.13; 204/298.19; 204/298.2
(58) Field of Search ....................... 204/192.12, 298.12, 204/298.19, 298.13, 298.2

(56) References Cited

U.S. PATENT DOCUMENTS 5,693,203 A * 12/1997 Ohhashi et al. ......... 204/298.12
6,497,797 B1 * 12/2002 Kim ....................... 204/192.13
6,682,637 B2 * 1/2004 Heinz et al. ............. 204/298.2

* cited by examiner

*Primary Examiner*—Steven Versteeg
(74) *Attorney, Agent, or Firm*—Notaro&Michalos PC (57) ABSTRACT

Method for sputtering from a dielectric target (9) in a vacuum chamber (2) with a high frequency gas discharge, the target (9) being mounted on a cooled metallic back plate (10) and this back plate forming an electrode (10) supplied with high frequency, includes a target thickness (Td) profiled (15) differently over the surface such that in the regions of a desired decrease of the sputtering rate the target thickness (Td) is selected to be greater than in the remaining regions.

20 Claims, 10 Drawing Sheets

TARGET COMPRISING THICKNESS PROFILING FOR AN RF MAGNETRON

FIELD AND BACKGROUND OF THE INVENTION

The present invention relates to a method for sputtering a dielectric target in a vacuum chamber with a high frequency gas discharge, as well a sputter target and a magnetron sputter source with a corresponding sputter target. The dielectric layer is deposited onto a workpiece, in particular a synthetic workpiece, with the aid of the known high frequency cathode sputtering method, in particular with magnetron sputtering in a vacuum chamber. Such layers are in particular applied in the production of storage plates. Among them for example optical recording methods, where the information is impressed in the plate itself and is provided with a highly reflecting layer, with a laser beam being capable of scanning the information correspondingly. In particular in the vacuum coating of optical disks with the aid of the static sputtering method with round cathode configurations with nonconducting materials, and especially in the coating of rewritable disks, good layer thickness distributions over the disk are necessary and must also be maintained over the process time, respectively the target working life.

For coating optical storage disks metallic as well as also nonconducting dielectric layers are deposited on a substrate, the data medium, the conducting metallic layers can be coated relatively simply. For coating with dielectric layers two methods are in the foreground. The one method is the so-called reactive sputtering from a conducting target. The sputtered material is herein oxidized to a nonconducting layer in the process volume or when impinging on the substrate with the aid of the reactive gas introduced into the process volume.

The other method for sputtering nonconducting substrate material is the high frequency nebulizing sputtering. Since in this case the target is not conducting, it cannot be sputtered with a DC voltage, since through the formation of a surface charge, the entire applied voltage drops over the target and not, as desired, in the plasma volume. Consequently no current can flow through the target into the plasma volume. By applying a radio frequency AC voltage the surface charges can each be led during the positive half wave from the target, the target acts like a capacitor with impedance $Z = 1/i\omega C$ and causes a dielectric displacement current to flow. The frequencies required for this purpose are in the high frequency range, that is in the range of >1 MHz, and the industrial frequency in the range of 13 MHz for practical reasons is a suitable choice.

To increase the target utilization and to improve the layer uniformity on the substrate, the target is eroded over a relatively large radial area. A close relationship exists between erosion profile and layer thickness distribution on the substrate. The desired erosion profile can be generated for example through a rotating magnet system, through suitably disposed magnets and pole shoes or through correction effects, for example additionally over the target working life or temporarily variable magnetic fields. Especially in statically disposed substrates, such as the storage disks, which are stationarily disposed at a distance of a few centimeters opposite a flat target, these conditions play a special role. In such vacuum coating systems the disks are cycled in through an interlock and coated in front of the target at a defined distance, with the coating time as a rule amounting to a few seconds to a few minutes. With such a sputter target thousands of disks are coated until it must be replaced after the target has been eroded so far, or when the erosion profile is too deep and the target must be replaced. Through the erosion profile, which changes over the working life of the target, the distribution conditions on the substrate also change, and this can have negative effects on the distribution especially in magnetron sputtering sources which have especially high sputtering rates and therefore are especially preferred today.

To generate a suitable erosion profile during DC sputtering, various methods are applied. For example, through the suitable disposition of the magnets which rotate in the region of the backside of the target, the most diverse erosion profiles can be generated. With the suitable choice of magnet configuration, the profile of the erosion rate can also be kept substantially constant even over the entire target working life. But it was found that this cannot be carried out in the same manner in high frequency sputtering (RF sputtering). For this reason attempts are made for example to compensate the discrepancies over the target working life with additional control magnets or with multi-part configuration of the cathode through suitable driving. These methods have been known for a relatively long time but they have the disadvantage that they are expensive in realization and that highly complex conditions obtain. The complexity of the processes increases the probability of operating errors, especially in industrial use.

SUMMARY OF THE INVENTION

The present invention addresses the problem of eliminating the disadvantages of prior art, especially in realizing a coating method for dielectric materials with which at high economy a predeterminable distribution profile can be attained, and which in addition provides the capability of compensating distribution changes over the target working life of a sputter source. This problem is solved according to the invention after the method according to the independent claims. The independent patent claims refer to advantageous further embodiments.

The dielectric, and consequently nonconducting, sputter target material is secured, or bonded, for high frequency sputtering on a so-called support plate or back plate, and this must be completed in such a manner that good thermal contact is given. The support plate is necessary with dielectric materials, on the one hand, to hold the brittle material and, on the other hand, to attain good heat distribution. The support plate is cooled and consequently indirectly also the target bonded thereon.

As stated, an important application is the deposition of dielectric layers for optical storage plates, such as in particular for phase change disks. An important application herein is the coating with a target material comprising ZnS and $SiO_2$. As a rule, such targets are sintered during their production. Maintaining maximum layer uniformity during the process times is especially important in this application.

It was found that the capacitance developing between metallic conducting bonding plate and the plasma developing in the front region of the target is different if the dielectric target is developed of different thickness with respect to the bond plate in subregions of the target. It thereby becomes possible to affect locally the discharge or the discharge density. Through this approach the sputter distribution can be affected if in the desired regions the target thickness is varied over the target face. In the thinner region the capacitance between plasma and target support plate is increased, which also results in these regions in an increase of the sputter rate. Through the corresponding profiling of the target, consequently, the distribution can be affected to the desired extent. This type of correction capability is especially favorable when using magnetron sputter sources, which develop inherently different erosion profiles through the magnetic field-enhanced plasma generation and these erosion profiles, generated by the magnetic field, effect distribution profile shifts over the target working life. For example, in regions of strong erosion due to the magnetic field this pronounced erosion can be compensated by a thickening of the target via the capacitive effect. In regions of the weaker erosion by the magnetic field through a thinning of the target an increase of the sputter rate is brought about. Consequently, a compensation of the effect is also possible. Profiling of the target can take place for example on the front side facing the plasma, and the target support plate can be shaped on the back side as a planar plate. A further option also comprises profiling the support plate and to dispose between a flat target plate and the profiled support plate a further dielectric with good thermal conductivity, which is more readily workable than the target material itself and consequently represents a compensation dielectric with the advantage that the brittle target material itself can be implemented as simple as possible for example as a planar plate. The previously cited profiling options can also be combined. But for reasons of simple manufacture those solutions are preferred which permit the simplest possible contours or even permit a purely plate-form target, wherewith the production process can be carried out economically. Apart from simple depressions or elevations, other forms of profiling also have an effect such as for example trapezoidal, spherical, toroidal ribs or grooves. With the profiling thus the erosion rate, but in particular the radial distribution of the erosion rate in round targets, can be stabilized over the entire target working life. When sputtering conductive target materials with RF or DC sputtering, this effect does not occur.

BRIEF DESCRIPTION OF THE DRAWINGS

In the following the invention will be explained by example in further detail in conjunction with schematic Figures. Therein depict:

FIG. 1 schematically and in cross section a basic configuration of a vacuum installation with high frequency sputtering device, FIG. 2 a target bonded on a support plate with erosion profile according to prior art, FIG. 3 a target with erosion profile bonded on a support plate in round development with profiling in the center and on the front side, FIG. 4 in cross section a profiled target bonded on a support plate with profiling in the center on the target back side, FIG. 5 in cross section a planar target with erosion profile bonded on a profiled support plate with compensation dielectric as intermediate layer, FIG. 6 a graph representing the erosion rate as a function of the target working life measured in different radii in the case of a flat round target according to prior art, FIG. 7 a graph showing the erosion rate as a function of the target working life, measured at different radii of a profiled round target according to the invention, FIG. 8 an electric equivalent diagram regarding the functional mechanism of a profiled dielectric target in a high frequency discharge, FIG. 9 different distributions measured on a disk coated with RF sputtering over the diameter at different stages of the target working life for a planar target according to prior art, FIG. 10 distribution measurement corresponding to the preceding FIG. 9 for a target profiled according to the invention, FIG. 11 cross section through a target at different target service lives for a planar target according to prior art, FIG. 12 cross section through a target profiled according to the invention with different erosion profiles at different target working lives.

DESCRIPTION OF THE PREFERRED EMBODIMENTS.

Figure 1:
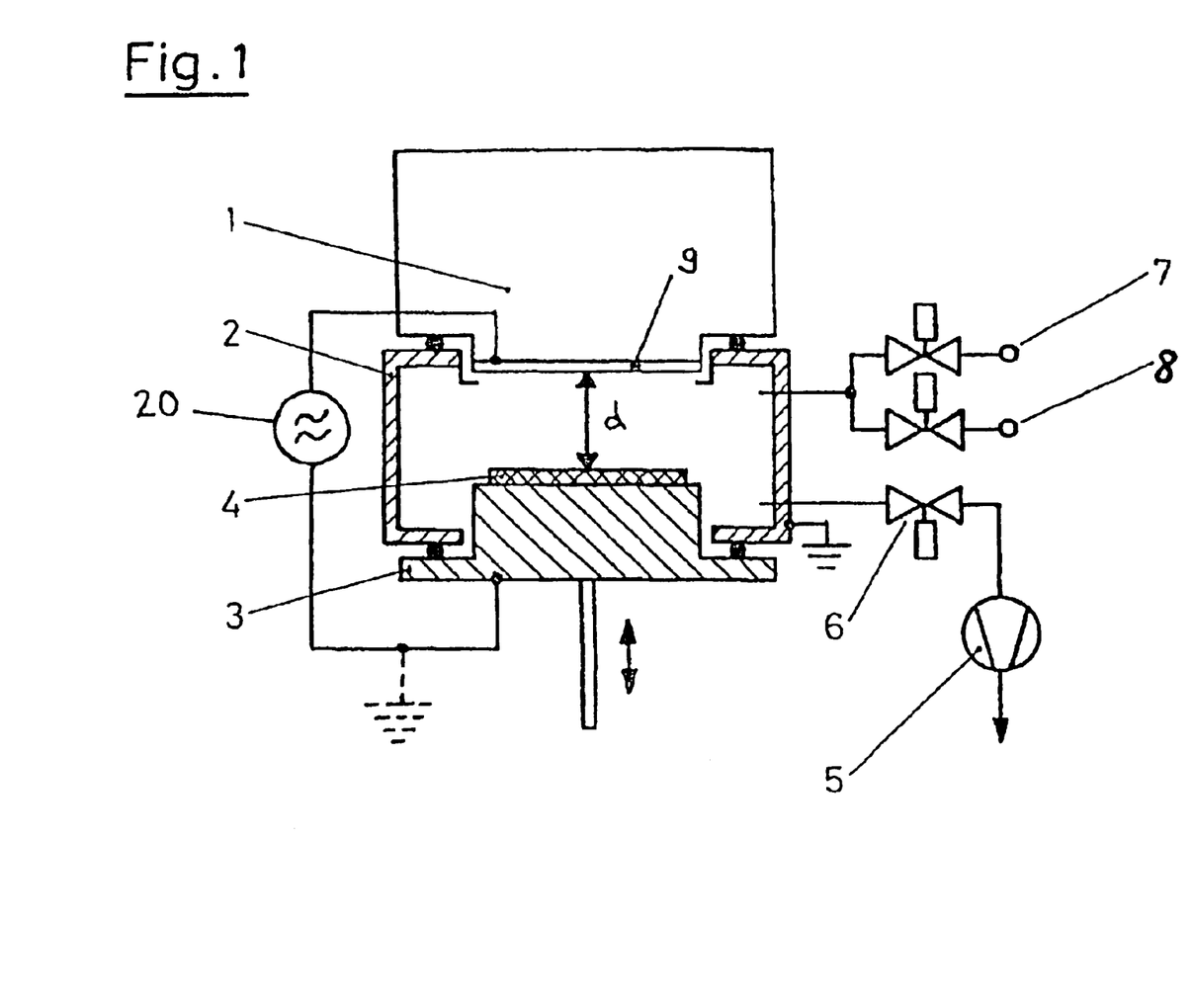

High frequency sputtering sources for vacuum coating processes are employed in varied manner. Especially the magnetron sputtering technique with magnetic field-enhanced plasma generation is preferably employed due to the high attainable rates and due to the capability of affecting the sputtering characteristic via the magnetic field. Sputtering sources of this type can be developed in different geometries, for example tubular with target tubes also rotating, planar with targets disposed a really, such as rectangular cathodes, or also cathode configurations, or also as cathodes developed in the form of an arch or those developed hollow. In order to attain a good distribution of the deposited layer, the workpieces or the substrates to be coated can be moved with respect to the sputtering target. But they are often used for fully automated installations, so-called static coating configurations, in which the workpiece is stationarily disposed at a distance of a few centimeters opposite a cathode with sputtering target, which makes the installations become more compact and simpler. A typical stationary condition is shown schematically in FIG. 1. A vacuum chamber (2) is evacuated with a vacuum pump (5) via a valve (6). The gases necessary for the generation of the plasma can be introduced via the gas inlet arrangement (7, 8) and an appropriate working pressure is set. As working gases for the sputtering primarily heavy inert gases such as argon are suitable and in reactive processes additionally reactive gases, such as for example oxygen, nitrogen, etc. The vacuum chamber (2) includes a substrate holder (3), which here, as shown schematically, is developed as a type of interlock, in that it can be lowered in order to be able to equip the substrate holder (3) with a workpiece (4). It is understood that highly varied capabilities exist for developing such loading stations. As a rule, separate interlock configurations are employed such that the process volume is separated from the inward-transfer chamber and the vacuum conditions in the process area, in which is also disposed a sputtering source (1), are separated. Opposite the workpiece (4) at a distance (d) of, as a rule, a few centimeters, such as for example 4 to 5 cm, the sputtering source (1) is disposed, which includes the target (9) to be sputtered. Between the target (9) and the substrate (4), or substrate holder (3), is supplied power at high frequency by means of high frequency generator (20) for generating a plasma discharge between target (9) and substrate (4). In the case of this type of sputtering processes, the vacuum chamber (2) is customarily grounded, and the substrate-side high frequency terminal also, as is shown in dashed lines in the Figure. But it is also possible in known manner to supply the sputtering source (1) as well as the workpiece and/or also the receptacle with superimposed voltages with so-called bias voltages, to attain specific effects.

Figure 2:
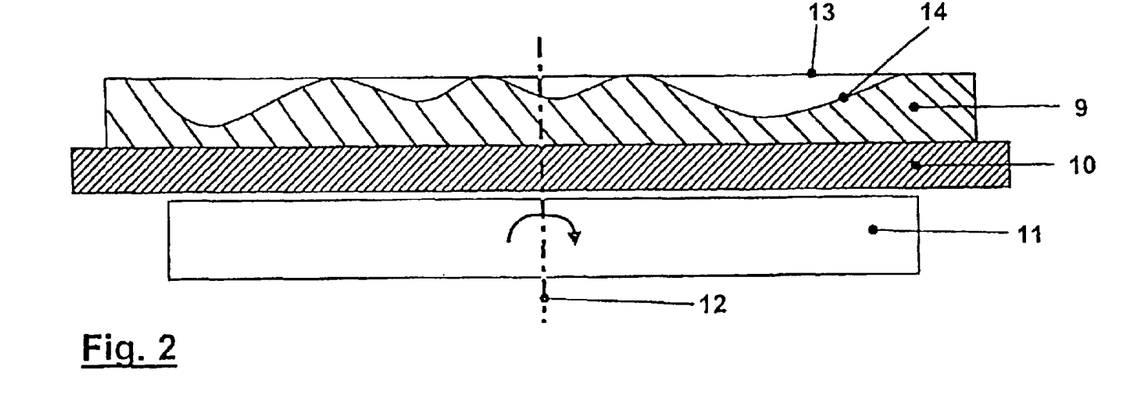

The sputtering source (1) includes the target (9) which is shown in FIG. 2 in cross section. The Figure shows a typical structure of a target configuration (9, 10), such as is used in the preferred magnetron sputtering sources, according to prior art. Herein a planar dielectric target plate (9) with a level new target face (13) is bonded onto a support plate (10) which is cooled in a manner not shown here. On the back side of the target configuration (9, 10) a magnet system (11) is disposed, which forms the electron trap configuration of the plasma discharge. In such a magnetron sputtering source with round target configuration (9, 10) the magnet system (11) in operation is preferably moved about the central axis (12) in order to generate a suitable form of the erosion on the target surface through the eccentric disposition of the magnetic field configuration. Similar techniques are also utilized for example in rectangular target configurations through linear movements. Furthermore is shown an erosion profile (14), which has a typical development for a magnetron sputtering source, with the erosion profile already showing an essentially consumed, or sputtered, target.

In FIG. 3 is again shown a cross section through a round target as in FIG. 2 with a sputtering target (9), which on the front side comprises in the center a target profiling (15). The profiling (15) is developed in the form of steps, such that in the center the target thickness is decreased and there according to the invention the rate is increased through the capacitive effects of the high frequency discharge in order to compensate in this area the effect of the strong erosion on the outer margin.

Figure 4:
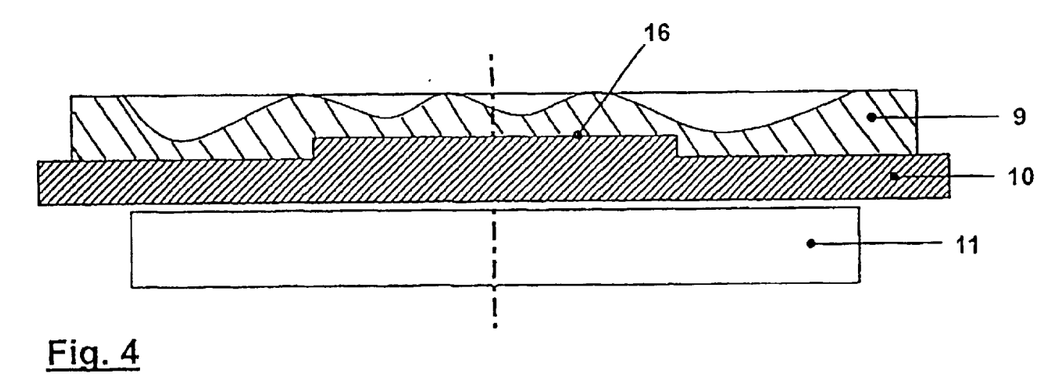

In a further embodiment in FIG. 4 is shown the manner in which a target (9) can be profiled on its back side, and the metallic support plate (10) is fitted into this depression of the profiling (16) in order to attain the inventive effect.

Figure 5:
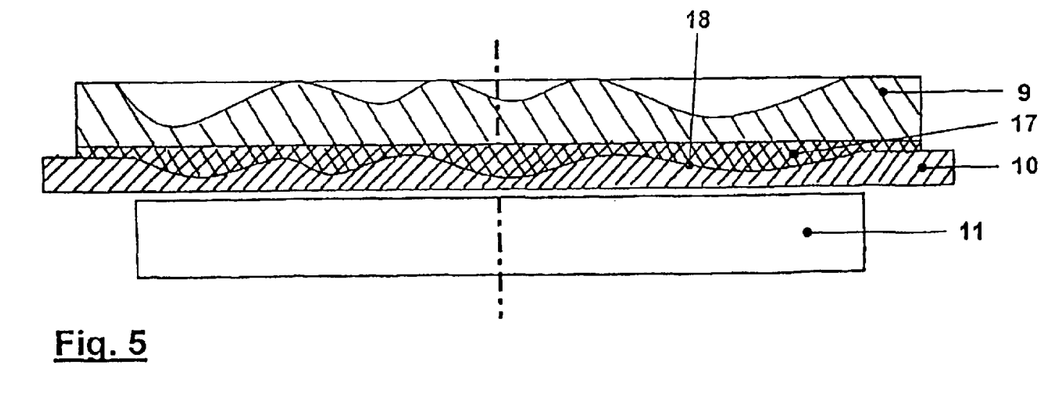

A further capability for realizing different dielectric thicknesses on the target is shown in FIG. 5. Starting with a planar target (9), which is especially simple and consequently economical to produce, the profiling (18) is generated in the support plate (10) and between the target (9) and the support plate (10) is provided a further dielectric layer (17) which acts as a compensation. The advantage of this embodiment comprises that for the compensation dielectric (17) a material can be selected which can be formed more simply than the sputtering target material (9) and consequently the costs for the target production can be substantially lowered. As the compensation dielectric (17) are suitable materials with an $\epsilon$ between 2 and 50, for example synthetic materials or also ceramic materials, with good heat conductance, such as for example aluminum oxide $Al_2O_3$. A significant advantage in this configuration comprises furthermore that the compensation dielectric (17) can be left on the support plate (10), and the planar new target (9) can be adhered directly onto the planar interface without having to generate the profiling itself anew each time.

Figure 6:
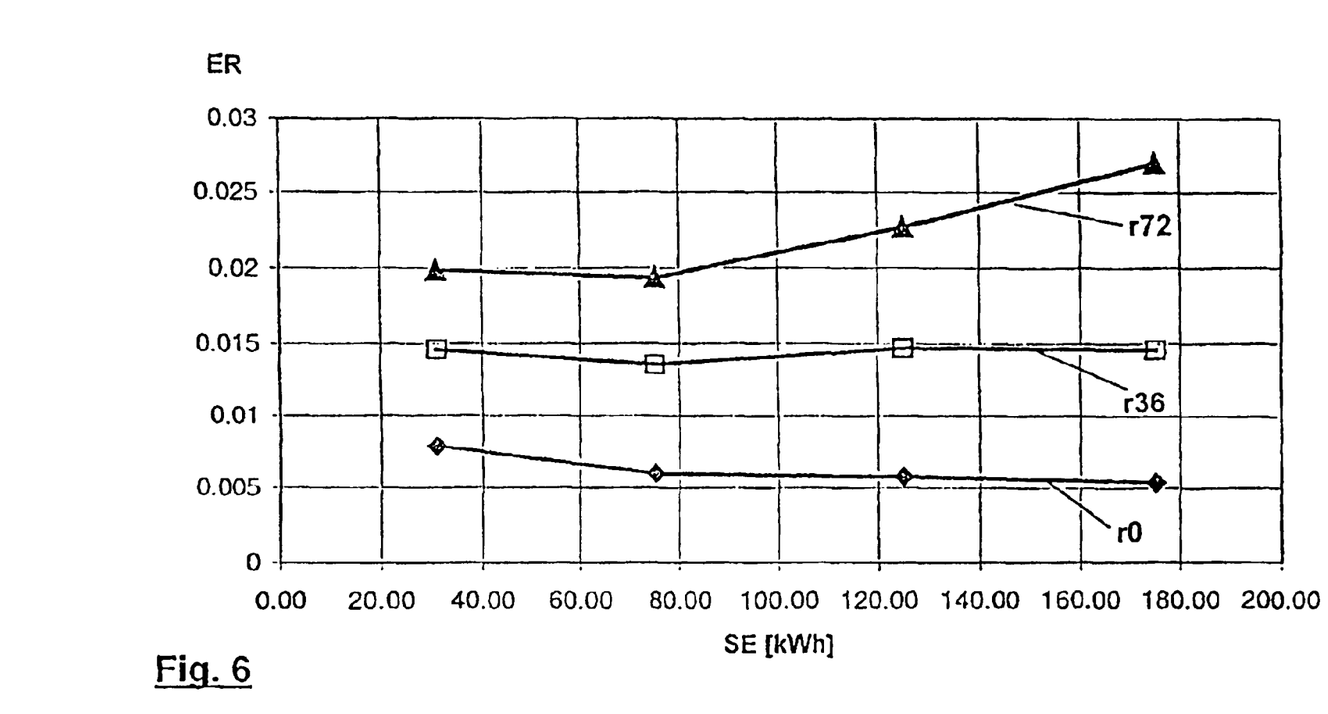
Figure 9:
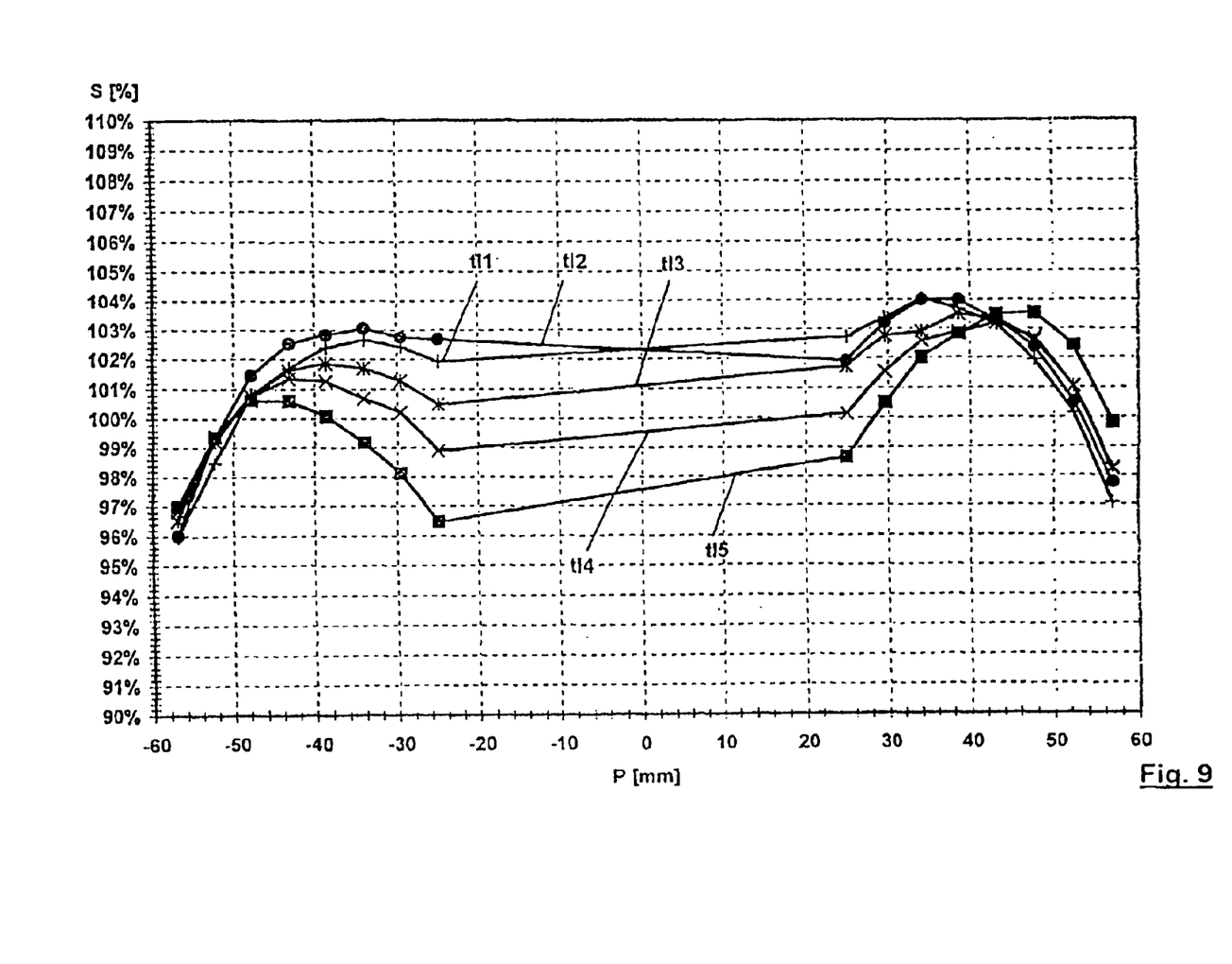

In FIG. 6 for a planar sputtering target according to prior art and the embodiment according to FIG. 2 the manner is shown in which the erosion rate ER behaves as a function of the sputtering energy SE (target working life) in kWh, measured at the three erosion zones with radius r0, r36 and r72 measured in mm from the center of the round target. It is clearly evident that the erosion rates diverge from one another which, over the target working life leads to a shift of the distribution profile on the substrate (see FIG. 9).

Figure 7:
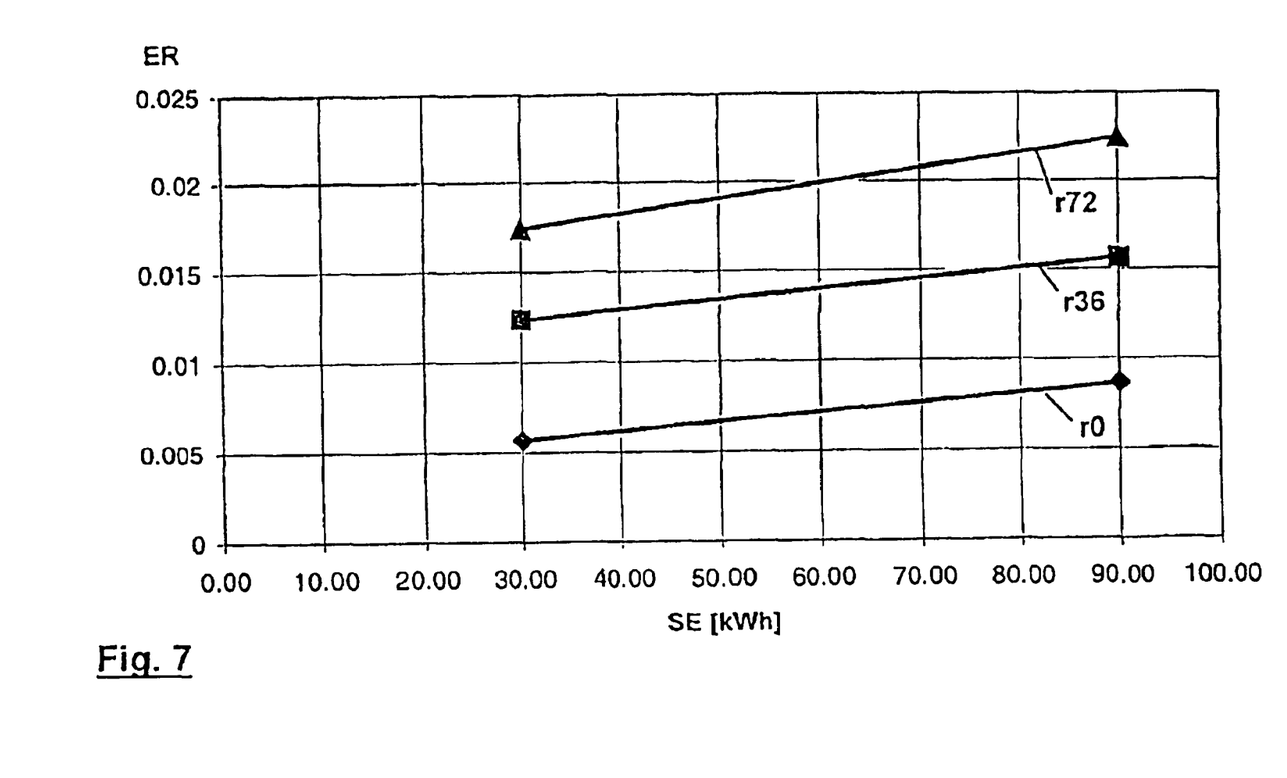

In FIG. 7 in the same representation the behavior of an inventive target embodiment according to FIG. 2 is shown. It is herein evident that the erosion rates extend uniformly over the target working life, which leads to the stabilization of the distribution profile on the substrate. Measured were the conditions in both cases with a 6 mm thick target of ZnS and $SiO_2$ with a diameter of 200 mm and a target substrate distance of 40 mm, where the substrate diameter was 120 mm and the frequency of the RF generator was 13 MHz. To confirm the effect, with the same sputtering configuration also a flat aluminum target with identical dimensions was sputtered. The tests show that the effect occurs specifically during high frequency sputtering of nonconducting materials, however not during high frequency sputtering of conducting materials.

Figure 8:
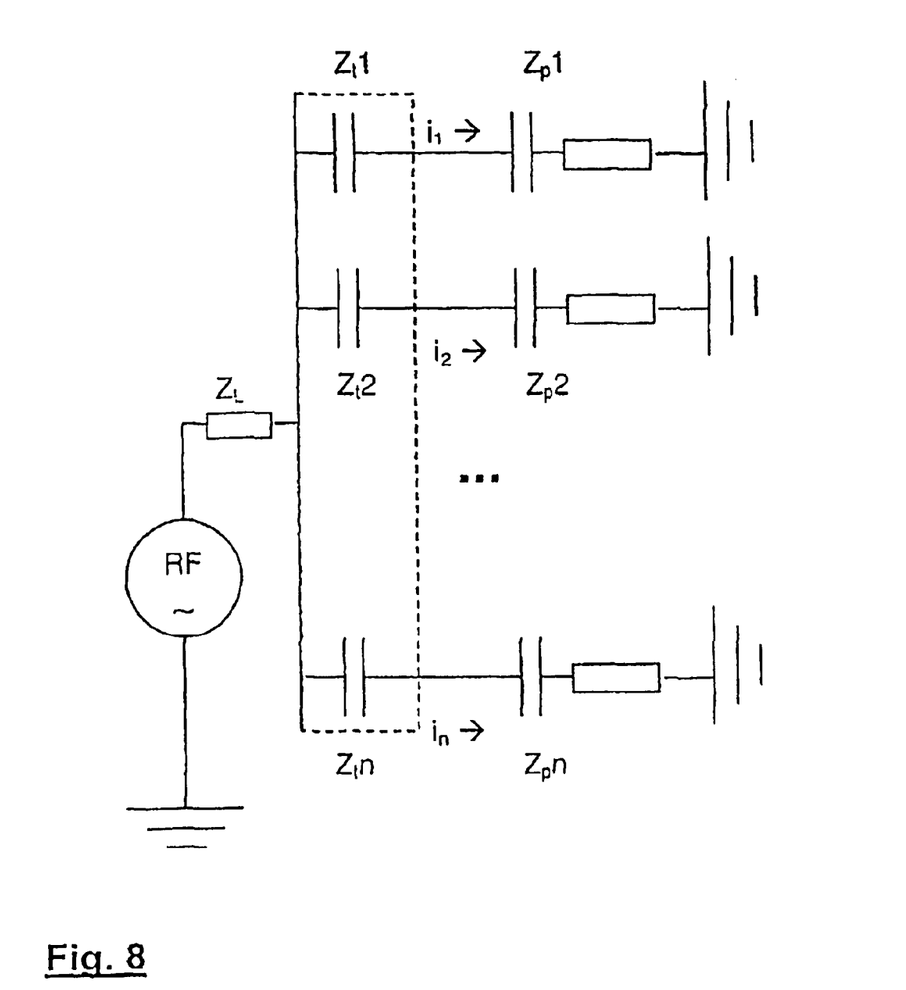

For the qualitative description of the effect a highly simplified electric circuit diagram of an RF sputtering configuration with insulating target material is depicted in FIG. 8. Depicted is the radial sputter erosion rate through specific variable radius-dependent plasma and target impedances $Z_p(r)$ and $Z_t(r)$. In addition to the target capacitance, $C_t$ also the losses in the target, determined by the loss angle $\delta$ of the dielectric target, are of significance. The tangent of the loss angle is defined as $\tan(\delta)=Im(Z)/Re(Z)$ of the impedance of the target measured at the working frequency of typically 13 MHz and describes the discrepancy from the purely capacitive behavior and consequently also the energy losses in the dielectric. Values below 0.05 for $\tan(\delta)$ are attainable in commercially available targets. Typical values for the total target capacitance are $C_t$=200 pF and the target impedance $|Z|$=60 $\Omega$, for the plasma capacitance $C_p$=300 pF and the plasma impedance $Im(Zt)$=40 $\Omega$. The real part of the impedance $R_p=R_e(Z_p)$ is approximately 20 $\Omega$. The orders of magnitude of the values are comparable, especially the target capacitance affects significantly the plasma discharge. With increasing erosion the target becomes thinner and the target capacitance $C_t=A\epsilon/d$ becomes greater. Thereby the power distribution over the target and plasma is changed, the losses in the supply lines, shown schematically by $Z_L$ (including supply impedance), are reduced and the rate increases with constant power driving, as is evident in FIG. 7. Decisive for the power distribution are the differential impedances dU/dI in the plasma, which are very low due to the flat characteristic in the voltage range used. If the thickness change of the target takes place selectively, for example preferably on an outer radius of the target, the rate at this site increases superproportionally since here the current density increases due to the decreasing target impedance. To prevent this, through a thickness change of the target an incremental impedance is added in series with $|Z|$ proportional to the thickness, which reduces the acceleration of the erosion rate. The same effect is attained through a reduction of the target thickness at the sites of deeper erosion rate.

Figure 11:
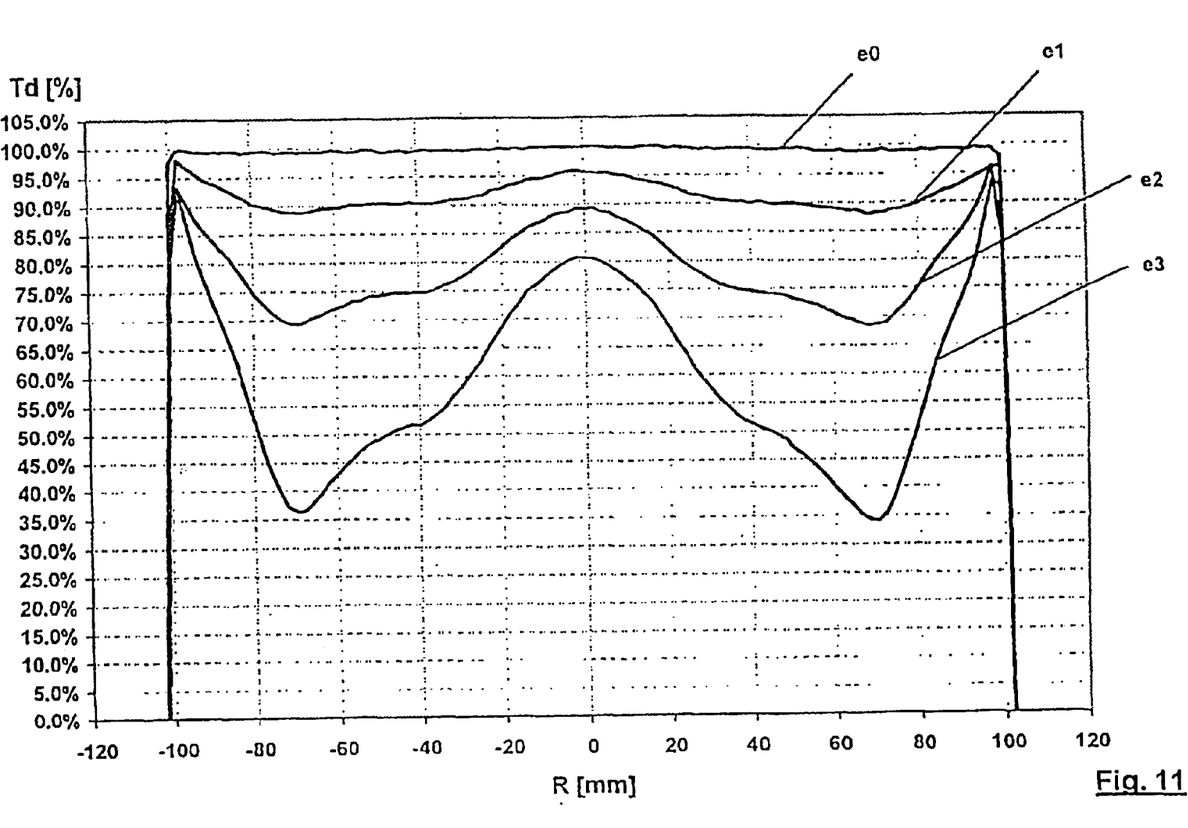

The positive effect of the invention will be once again described based on the distribution measurements on the substrate. A planar dielectric target according to prior art was sputtered under the conditions as stated already and the distribution characteristic over the disk diameter is measured at different target serving lives. The results are evident in FIG. 9, where the relative layer thickness S is depicted in percentages as a function of the substrate position, or distance from the substrate center in mm, at different operating times t11 to t15 over the target working life. For typical optical storage plates, only the regions from ±25 to 60 mm were measured, since there is a hole in the center of the synthetic disk. Curve t11 was measured at the beginning of the target working life, the curve t12 after 80 kWh, the curve t13 after 200 kWh, the curve t14 after 270 kWh and the curve t15 after 385 kWh, that is approximately at the end of the working life of the target. The depiction shows that over the target working life strong shifts and tiltings of the distribution curves occur, wherewith the layer thickness distribution over the target working life on the storage plate varies in impermissible manner. The associated target is depicted in cross section in FIG. 11. Shown are the different erosion profiles over the target working life, that is the target thickness in percent as a function of the target radius R in mm. The target surface not yet sputtered off is shown with profile e0, e1 shows the erosion profile which develops after 80 kWh of operating time, e2 after 200 kWh operating time and e3 after 385 kWh operating time, that is approximately at the end of the target working life.

Figure 3:
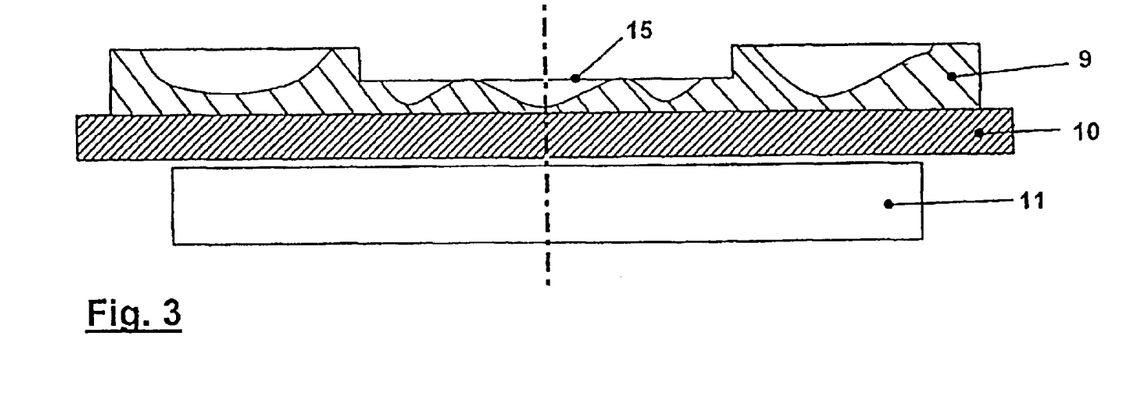
Figure 10:
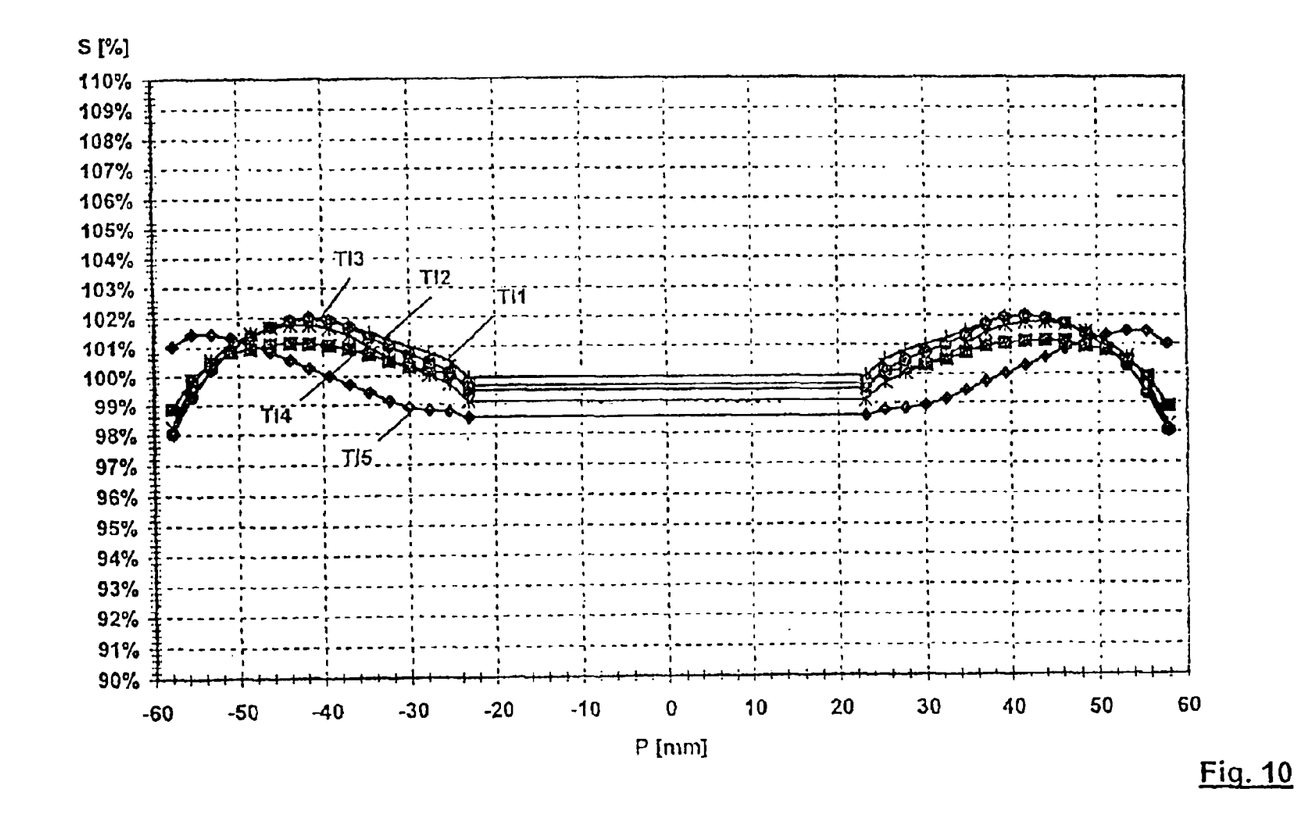
Figure 12:
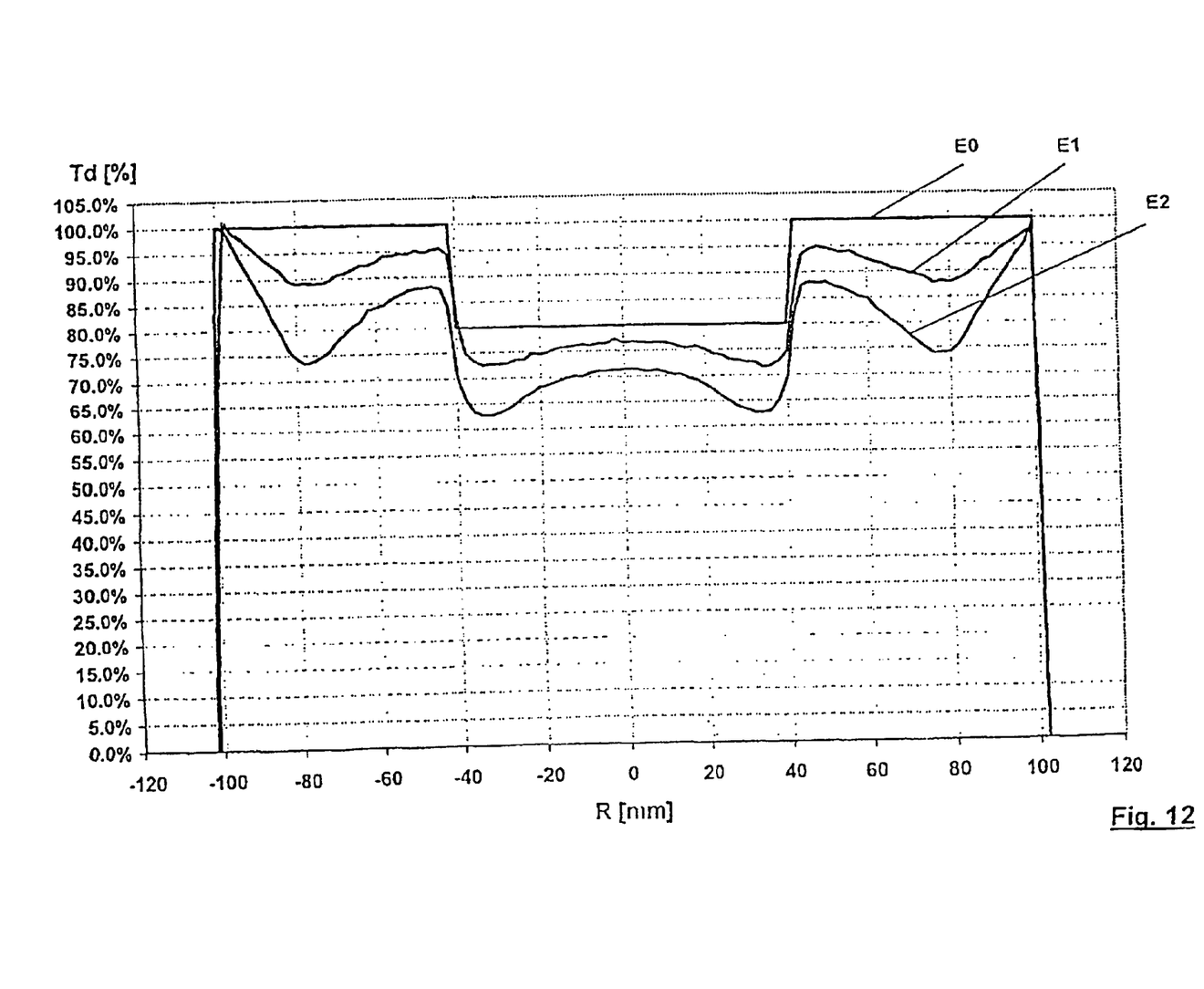

For comparison, the same measurements under identical conditions with an inventive profiled target, corresponding to a target profiling according to FIG. 3, is shown in the graphs of FIGS. 10 and 12. T11 shows the distribution at the beginning of the target working life, T12 after 60 kWh, T13 after 121 kWh, T14 after 253 kWh and T15 after 307 kWh at the end of the target working life. FIG. 12 shows again a cross section of the target, that is the target thickness in percent as a function of the radius in mm of the target disk. The new condition of the profiled target surface is denoted by E0, E1 after an operating time of 60 kWh and E2 after an operating time of 121 kWh. In both FIGS. 10 and 12 is evident the manner in which the inventive profiling of the dielectric target has a positive effect. The distribution profile T11 to T15 show very low discrepancies over the entire target working life. This shows directly the stabilizing effect of target profiling over the target working life. A further advantage of target profiling results therefrom that in particular when high requirements are made of the layer thickness precision on the substrate the material utilization of the target is increased since the entire target thickness can be better utilized. On the one hand, this leads to better material utilization and, on the other hand, to longer service life of the target and consequently to higher throughputs per target employed, which significantly increases the economy. Overall also a slightly higher rate can be observed through the decrease of the target impedance in the zones of reduced target thickness. The process can, moreover, also be carried out more simply since hardly more expenditures are necessary with respect to the external control or readjustment of the sputtering process for attaining a good distribution. Overall the structuring of the cathode and the entire configuration is thereby also simplified.

What is claimed is:

1. Method for sputtering from a dielectric target (9) in a vacuum chamber (2) with a high frequency gas discharge, with the target (9) being mounted on a cooled metallic back plate (10) and this back plate forming an electrode (10) supplied with high frequency, the method comprising:
    the target thickness (Td) being profiled (15) differently thick over the surface such that in the regions of a desired decrease of the sputtering rate the target thickness (Td) is selected to be greater than in the remaining regions.

2. Method as claimed in claim 1, wherein the high frequency gas discharge is magnetic field-enhanced (11).

3. Method as claimed in claim 2, wherein the magnetic field is moved relative to the target.

4. Method as claimed in claim 2, wherein the target profiling (15) compensates the erosion profiling (14) of the magnetic field, such that over the target working life the layer thickness distribution follows, which changes over the course of the target erosion and through the increasingly strong magnetic field effect.

5. Method as claimed in claim 1, wherein the target profiling (15) is provided such that a desired layer thickness distribution on the substrate occurs.

6. Method as claimed in claim 1, wherein the target material is profiled on the front and/or on the back side and, in the case of back side profiling of the target (9), the back plate (10) follows the target profiling.

7. Method as claimed in claim 1, wherein between the target (9) and the back plate (10) a profiled compensation dielectric (17) in thermal contact is disposed and the back plate (10) essentially follows this profiling.

8. Method as claimed in claim 1, wherein the high frequency gas discharge is magnetic field-enhanced (11) with a magnetron magnetic field generated by a magnet system (11) being at least partially disposed in the region of the target back side.

9. Method as claimed in claim 8, wherein the magnetic field is rotated relative to the target about a central axis (12).

10. Sputtering target of a dielectric material (9) bonded on a support (10) of metal, wherein the target (10) on a front side and/or on a back side has a profiled structure (15, 16) and between the dielectric target (9) and the profiled support, a compensation dielectric (17) is disposed.

11. Sputtering target as claimed in claim 10, wherein in the case of a target (9) profiled on the back side, the support (10) follows the profiling (16), with, in particular, the target (9) as well as also the support (10) being essentially developed in the form of plates.

12. Sputtering target as claimed in claim 10, wherein the profiling (15, 16) in the regions of the strongest target erosion is developed thicker than in the remaining regions.

13. Sputtering target as claimed in claim 10, wherein the compensation dielectric has an of 2 to 50 and preferably is comprised of ceramics with good thermal conductivity.

14. Sputtering target as claimed in claim 13, wherein the ceramics is $Al_2O_3$.

15. Sputtering target as claimed in claim 10, wherein the target (9) is a magnetron sputtering target.

16. High-frequency magnetron sputtering source (1), containing a target (9) according to claim 10.

17. Magnetron sputtering source as claimed in claim 16, wherein a high frequency generator (20) is connected with the target support (10) and the high frequency generator (20) generates a frequency $\geq 1$ MHz.

18. Sputtering target of dielectric material (9) bonded on a support (10) comprised of metal, comprising the target (9) on a front and/or back side, has a profile structure (15, 16), with the target comprising ZnS and $SiO_2$ and that at 13.5 MHz the value of the loss angle $\delta$ satisfies the condition $\tan(\delta)<0.05$.

19. High-frequency magnetron sputtering source (1), containing the target of claim 18.

20. Magnetron sputtering source as claimed in claim 19, wherein a high frequency generator (20) is connected with the target support (10) and the high frequency generator (20) generates a frequency $\geq 1$ MHz.

* * * * *